US010431611B2

(12) United States Patent
Duan et al.

(10) Patent No.: US 10,431,611 B2
(45) Date of Patent: Oct. 1, 2019

(54) METHOD FOR MANUFACTURING THIN FILM TRANSISTOR, METHOD FOR MANUFACTURING ARRAY SUBSTRATE, ARRAY SUBSTRATE AND DISPLAY DEVICE (71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xianxue Duan, Beijing (CN); Kui Gong, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/945,476

(22) Filed: Apr. 4, 2018

(65) Prior Publication Data
US 2019/0006396 A1    Jan. 3, 2019

(30) Foreign Application Priority Data

Jun. 30, 2017    (CN) .......................... 2017 1 0526266

(51) Int. Cl.
*H01L 21/02*        (2006.01)
*H01L 21/311*       (2006.01)
(Continued)

(52) U.S. Cl.
CPC .... *H01L 27/1288* (2013.01); *H01L 21/02175* (2013.01); *H01L 21/02178* (2013.01);
(Continued)

(58) Field of Classification Search
CPC . H01L 21/02244; H01L 27/1214–1296; H01L 29/66742–6678; H01L 29/786–78696
See application file for complete search history.

(56) References Cited

U.S. PATENT DOCUMENTS 5,326,712 A * 7/1994 Bae .................. H01L 21/02178
148/DIG. 1
2017/0115540 A1    4/2017 Song et al.
2017/0256421 A1    9/2017 Liu

FOREIGN PATENT DOCUMENTS

| CN | 104952881 A | 9/2015 |
| CN | 105374748 A | 3/2016 |
| CN | 105870169 A | 8/2016 |

OTHER PUBLICATIONS

Chinese Office Action issued in Chinese Patent Application No. 201710526266.3, dated Jul. 2, 2019; with English translation.

* cited by examiner

*Primary Examiner* — Daniel P Shook
(74) *Attorney, Agent, or Firm* — McDermott Will & Emery LLP (57) ABSTRACT A method for manufacturing a thin film transistor, a method for manufacturing an array substrate, an array substrate, and a display device are provided. The method for manufacturing the thin film transistor includes: forming an active layer on a base substrate; forming a metal layer on the surface of the active layer; and processing the metal layer using a patterning process for one time and an oxidation treatment process, so that the metal layer forms a source electrode, a drain electrode and a passivation layer; wherein the source electrode and the drain electrode are in contact with the active layer, and the passivation layer is formed on a side of the source electrode and the drain electrode away from the active layer.

15 Claims, 3 Drawing Sheets (51) Int. Cl.
*H01L 27/12* (2006.01)
*H01L 29/786* (2006.01)
*H01L 29/66* (2006.01)

(52) U.S. Cl.
CPC .. *H01L 21/02186* (2013.01); *H01L 21/02244* (2013.01); *H01L 21/02252* (2013.01); *H01L 21/02258* (2013.01); *H01L 21/31138* (2013.01); *H01L 27/1248* (2013.01); *H01L 29/66742* (2013.01); *H01L 29/78618* (2013.01)

METHOD FOR MANUFACTURING THIN FILM TRANSISTOR, METHOD FOR MANUFACTURING ARRAY SUBSTRATE, ARRAY SUBSTRATE AND DISPLAY DEVICE

CROSS-REFERENCE TO RELATED APPLICATION

This application claims priority to Chinese Patent Application No. 201710526266.3, filed on Jun. 30, 2017, titled "METHOD FOR MANUFACTURING THIN FILM TRANSISTOR, METHOD FOR MANUFACTURING ARRAY SUBSTRATE, ARRAY SUBSTRATE AND DISPLAY DEVICE", which is incorporated herein by reference in its entirety.

TECHNICAL FIELD

The present disclosure relates to the display technology field, more particularly, to a method for manufacturing a thin film transistor, a method for manufacturing an array substrate, an array substrate and a display device.

BACKGROUND

A thin film transistor array substrate is an important part of a liquid crystal display panel. A thin film transistor in the thin film transistor array substrate can control a deflection of the liquid crystal to achieve an image display of the liquid crystal display panel. Therefore, performances of the thin film transistor array substrate have a great influence on the display effect of the image of the liquid crystal display panel.

SUMMARY

In a first aspect, some embodiments of the present disclosure provide a method for manufacturing a thin film transistor. The method for manufacturing the thin film transistor includes:

forming an active layer on a base substrate;

forming a metal layer on a surface of the active layer;

processing the metal layer using a patterning process for one time and an oxidation treatment process to form a source electrode, a drain electrode and a passivation layer; wherein the source electrode and the drain electrode are in contact with the active layer, and the passivation layer is formed on a side of the source electrode and the drain electrode away from the active layer.

Optionally, the processing the metal layer using the single patterning process once and the oxidation treatment process to form the source electrode, the drain electrode and the passivation layer includes:

forming a photoresist layer on a surface of the metal layer;

processing the photoresist layer using the patterning process for one time to form a photoresist completely-removed region, photoresist partly-reserved regions and a photoresist completely-reserved region; the photoresist partly-reserved regions are connected to the photoresist completely-reserved region;

performing a complete oxidation treatment on a region of the metal layer corresponding to the photoresist completely-removed region to form a first passivation portion;

removing a photoresist in the photoresist partly-reserved regions;

performing a partial oxidation treatment on a region of the metal layer corresponding to the photoresist partly-reserved regions to form the source electrode, the drain electrode and a second passivation portion; wherein the source electrode and the drain electrode are in contact with the active layer, and the second passivation portion is formed on a side of the source electrode and the drain electrode away from the active layer; the first passivation portion and the second passivation portion form the passivation layer;

removing a photoresist in the photoresist completely-reserved region to form a conductive portion connected to the source electrode and the drain electrode.

Optionally, a processing time of performing the complete oxidation treatment on the region of the metal layer corresponding to the photoresist completely-removed region is greater than or equal to twice of a processing time of performing the partial oxidation treatment on the region of the metal layer corresponding to the photoresist partly-reserved regions.

Optionally, the performing the complete oxidation treatment on the region of the metal layer corresponding to the photoresist completely-removed region to form the first passivation portion includes:

performing an oxidation treatment on the region of the metal layer corresponding to the photoresist completely-removed region by an anodic oxidation method, and a metal material of the metal layer corresponding to the photoresist completely-removed region is oxidized to a metal oxide, so that the region of the metal layer corresponding to the photoresist completely-removed region forms the first passivation portion.

Optionally, the performing the partial oxidation treatment on the region of the metal layer corresponding to the photoresist partly-reserved regions includes:

performing an oxidation treatment on the region of the metal layer corresponding to the photoresist partly-reserved regions by an anodic oxidation method, and an upper portion of a metal material of the metal layer corresponding to the photoresist partly-reserved regions is oxidized to a metal oxide, so that the upper portion of the metal material of the metal layer corresponding to the photoresist partly-reserved regions forms the second passivation portion, and a lower portion of the metal material of the metal layer corresponding to the photoresist partly-reserved regions forms the source electrode and the drain electrode.

Optionally, the performing the complete oxidation treatment on the region of the metal layer corresponding to the photoresist completely-removed region includes:

performing an oxidation treatment on the region of the metal layer corresponding to the photoresist completely-removed region by a plasma oxidation treatment process, and a metal material of the metal layer corresponding to the photoresist completely-removed region is oxidized to a metal oxide, so that the region of the metal layer corresponding to the photoresist completely-removed region forms the first passivation.

Optionally, the removing the photoresist in the photoresist partly-reserved regions includes: performing an oxidation treatment on the photoresist in the photoresist partly-reserved regions by the plasma oxidation treatment process, so that the photoresist in the photoresist partly-reserved regions is oxidized to gas;

the performing the complete oxidation treatment on the region of the metal layer corresponding to the photoresist completely-removed region and the removing the photoresist in the photoresist partly-reserved regions are completed in one plasma oxidation treatment process.

Optionally, the performing the partial oxidation treatment on the region of the metal layer corresponding to the photoresist partly-reserved regions includes:

performing an oxidation treatment on the region of the metal layer corresponding to the photoresist partly-reserved regions by a plasma oxidation treatment process, and an upper portion of a metal material of the metal layer corresponding to the photoresist partly-reserved regions is oxidized to a metal oxide, so that the upper portion of the metal layer corresponding to the photoresist partly-reserved regions forms the second passivation portion, and a lower portion of the metal material of the metal layer corresponding to the photoresist partly-reserved regions forms the source electrode and the drain electrode.

Optionally, the removing the photoresist in the photoresist completely-reserved region includes: performing an oxidation treatment on the photoresist in the photoresist completely-reserved region by a plasma oxidation treatment process, so that the photoresist in the photoresist completely-reserved region is oxidized to gas.

Optionally, a method for processing the photoresist layer using the patterning process one is a halftone mask process.

Optionally, a material of the metal layer is selected from a group of aluminum, magnesium, titanium, aluminum alloy, magnesium alloy and titanium alloy.

Optionally, before forming the active layer on the base substrate, the method for manufacturing the thin film transistor further includes:

forming a gate layer on a surface of the base substrate;

forming a gate insulating layer on a surface of the gate layer, so that the active layer is formed on a surface of the gate insulating layer.

In a second aspect, some embodiments of the present disclosure further provide a method for manufacturing an array substrate using the method for manufacturing the thin film transistor provided in the first aspect. The method for manufacturing the array substrate includes:

providing a base substrate and forming an active layer on the base substrate;

forming a metal layer on the surface of the active layer;

processing the metal layer using a patterning process for one time and an oxidation treatment process to form a source electrode, a drain electrode, a passivation layer and a conductive portion connected to the source electrode and the drain electrode; wherein the source electrode and the drain electrode are in contact with the active layer, and the passivation layer is formed on a side of the source electrode and the drain electrode away from the active layer;

forming a pixel electrode on a surface of the passivation layer, and the pixel electrode is connected to the source and the drain electrodes through the conductive portion.

Optionally, the processing the metal layer using the patterning process for one time and the oxidation treatment process so that the metal layer forms the source electrode and the drain electrode, the passivation layer and the conductive portion connected to the source electrode and the drain electrode includes:

forming a photoresist layer on a surface of the metal layer;

processing the photoresist layer using the patterning process for one time to form a photoresist completely-removed region, photoresist partly-reserved regions and a photoresist completely-reserved region; the photoresist partly-reserved regions are connected to the photoresist completely-reserved region;

performing a complete oxidation treatment on a region of the metal layer corresponding to the photoresist completely-removed region to form a first passivation portion;

removing a photoresist in the photoresist partly-reserved regions;

performing a partially oxidation treatment on a region of the metal layer corresponding to the photoresist partly-reserved regions to form the source electrode, the drain electrode and a second passivation portion; wherein the source electrode and the drain electrode are in contact with the active layer, and the second passivation portion are formed on a side of the source electrode and the drain electrode away from the active layer; the first passivation portion and the second passivation portion form the passivation layer;

removing a photoresist in the photoresist completely-reserved region to form the conductive portion connected with the source electrode and the drain electrode.

Optionally, a processing time of performing the complete oxidation treatment on the region of the metal layer corresponding to the photoresist completely-removed region is greater than or equal to twice of a processing time of performing the partial oxidation treatment on the region of the metal layer corresponding to the photoresist partly-reserved regions.

In a third aspect, the embodiments of the present disclosure further provide an array substrate. The array substrate is manufactured by the method for manufacturing the array substrate provided in the second aspect.

In a fourth aspect, the embodiments of the present disclosure further provide a display device including the array substrate provided in the third aspect.

BRIEF DESCRIPTION OF THE DRAWINGS

The drawings are used to provide further understanding of the disclosure and constitute a part of the disclosure. Illustrative embodiments and descriptions of the present disclosure are used to explain the present disclosure, but do not constitute an inappropriate limitation to the disclosure. In the drawings.

DETAILED DESCRIPTION

The technical solutions in the embodiments of the present disclosure will be described clearly and completely with reference to the drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Illustratively, when a thin film transistor is manufactured, a source and a drain electrode are formed on an active layer firstly, a passivation layer covering the source electrode and the drain electrode is then formed on a surface of the source electrode and the drain electrode away from the active layer, after that, a via hole is formed on the passivation layer, so that a pixel electrode may be electrically connected to the source electrode and the drain electrode through the via hole when the pixel electrode is formed on a surface of the passivation layer. However, the source electrode, the drain electrode and the passivation layer are formed by two film formation processes combining multiple patterning processes, which makes the method for manufacturing the thin film transistor complicated.

Figure 1:
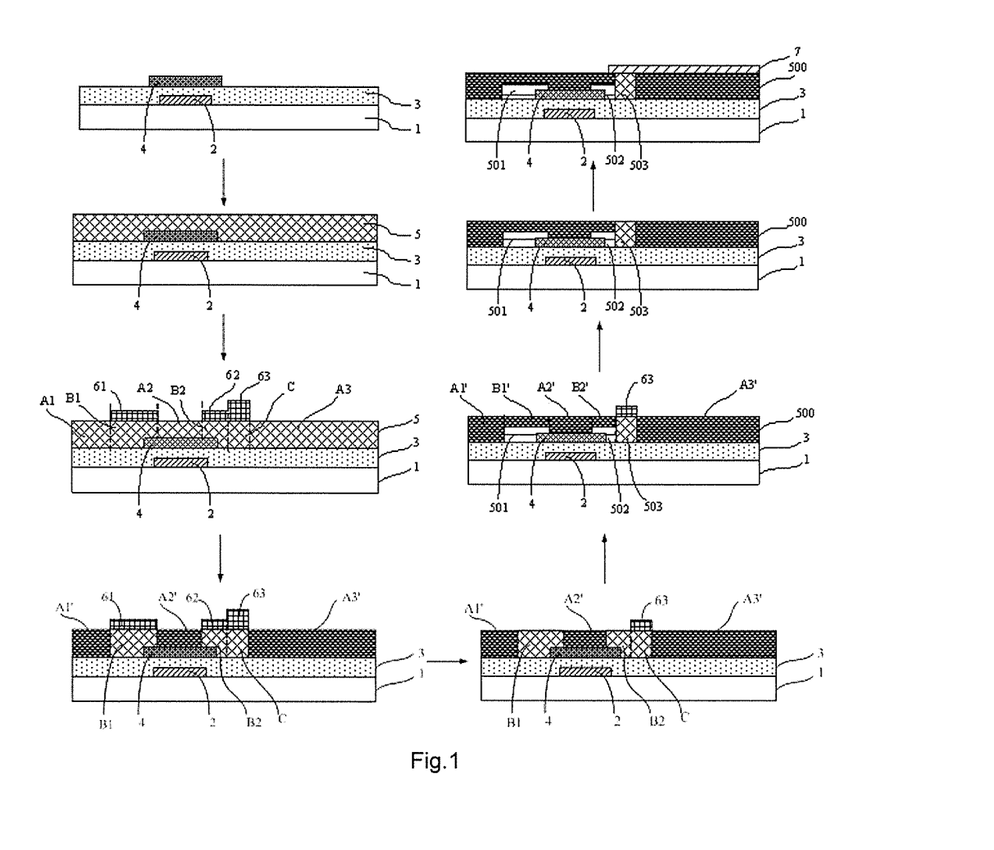
FIG. 1 is a structural flowchart of a method for manufacturing a thin film transistor provided in some embodiments of the present disclosure.
Figure 2:
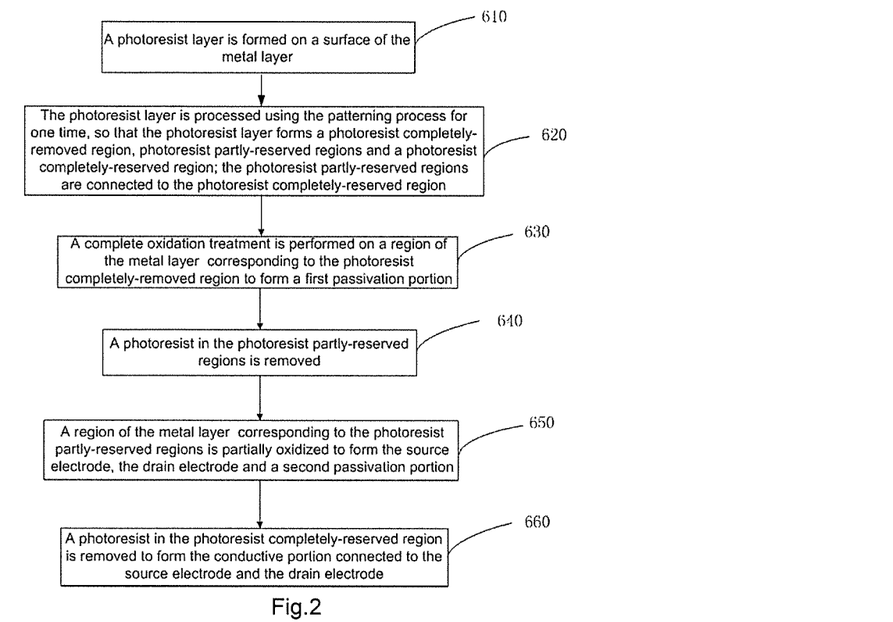
FIG. 2 is a first flowchart of a method for manufacturing a thin film transistor provided in some embodiments of the present disclosure.

As shown in FIG. 1 and FIG. 2, some embodiments of the present disclosure provide a method for manufacturing a thin film transistor. Specific steps of the method for manufacturing the thin film transistor are steps 100 and steps 400~600 (S100, S400~S600) as follows.

In step 100 (S100), a base substrate 1 is provided.

In step 400 (S400), an active layer 4 is formed on the base substrate 1.

In step 500 (S500), a metal layer 5 is formed on a surface of the active layer 4.

In step 600 (S600), the metal layer 5 is processed using a patterning process for one time and an oxidation treatment process, so that the metal layer 5 forms a source electrode 501 and a drain electrode 502 and a passivation layer 500. The source electrode 501 and the drain electrode 502 are in contact with the active layer 4, and the passivation layer 500 is formed on a side of the source electrode 501 and the drain electrode 502 away from the active layer 4.

It can be seen from the method for manufacturing the thin film transistor described above that, since the metal layer 5 is processed by a combination of using the patterning process for one time and the oxidation treatment process after the metal layer 5 is formed on the surface of the active layer 4, a portion of metal materials of the metal layer 5 is not oxidized, and thereby the source electrode 501 and the drain electrode 502 contacting with the active layer 4 are formed. And another portion of the metal materials of the metal layer 5 is oxidized to a non-conductive metal oxide to form the passivation layer 500 on a side of the source electrode 501 and the drain electrode 502 away from the active layer 4. It can be seen that, in the method for manufacturing the thin film transistor provided in the embodiments, the source electrode 501, the drain electrode 502 and the passivation layer 500 can be formed by only one film formation process combining the patterning process and the oxidation treatment process. Therefore, the method for manufacturing the thin film transistor provided in the embodiments of the present disclosure is relatively simple, which is advantageous to simplify the method for manufacturing the thin film transistor.

It should be noted that, a material of the metal layer 5 may be aluminum, magnesium, titanium, aluminum alloy, magnesium alloy or titanium alloy. Of course, the material of the metal layer 5 may be other oxidizable metal materials. Optionally, when the material of the metal layer 5 is aluminum, the material of the passivation layer 500 formed after oxidation corresponds to aluminum oxide. In the field of microelectronics, the alumina oxide has a high dielectric constant (about 8.1, whose dielectric constant is 4 times higher than SiO2), very low metal ion permeability, strong radiation resistance, no absorption peaks in the visible light and near-infrared regions and good transmission characteristics. Further, the alumina oxide has a high chemical stability and a high thermal conductivity, and a resistivity of the alumina oxide is about $3 \times 10^{15} \Omega \cdot m$, so its insulation is also very good. Therefore, when the material of the metal layer 5 is aluminum, an insulation performance and a light transmission performance of the passivation layer 500 may be improved, thereby reducing light loss.

In addition, as shown in FIG. 1 and FIG. 2, in the method for manufacturing the thin film transistor provided in the above embodiments, before the active layer 4 is formed on the base substrate 1, the method further includes steps 200~300 (S200~S300).

In S200, a gate layer 2 is formed on a surface of the base substrate 1.

In S300, a gate insulating layer 3 is formed on a surface of the gate layer 2, so that the active layer 4 is formed on a surface of the gate insulating layer 3.

When a material used for the passivation layer 500 is a metal oxide, the passivation layer 500 has a ceramic property, so that it is difficult to etch the via hole on the passivation layer 500 by using a dry etching method, thereby an etching rate of the via hole is extremely slow. In order to overcome this problem, as shown in FIG. 1, in S600, the metal layer 5 is processed using the patterning process for one time and the oxidation treatment process, so that the metal layer 5 forms the source electrode 501, the drain electrode 502 and the passivation layer 500, which specifically includes the metal layer 5 is processed using the patterning process for one time and the oxidation treatment process, so that the metal layer 5 forms a conductive portion 503 while forming the source electrode 501, the drain electrode 502 and the passivation layer 500.

Figure 3:
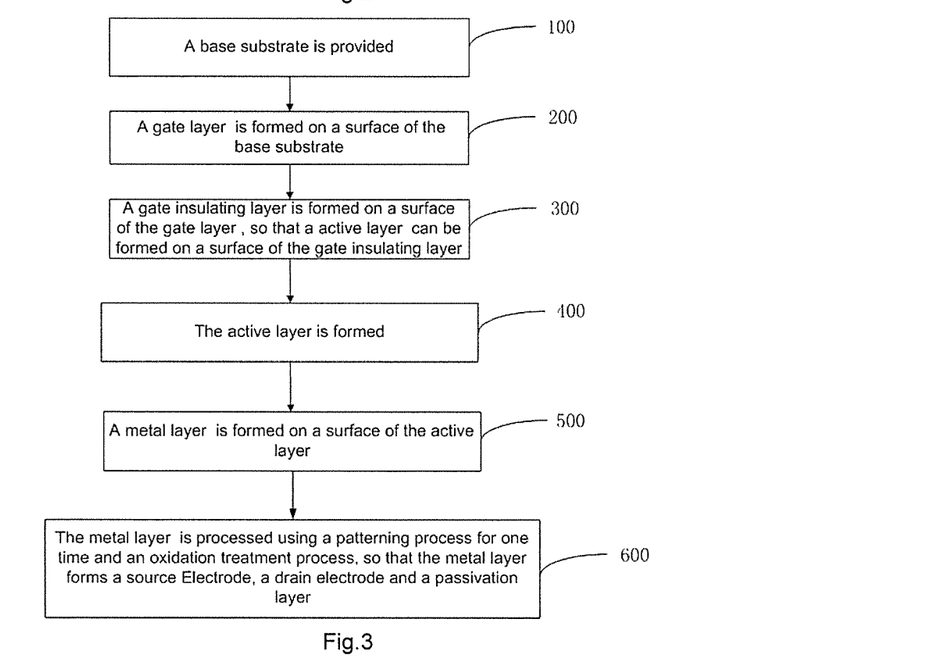
FIG. 3 is a second flowchart of a method for manufacturing a thin film transistor provided in some embodiments of the present disclosure.

As shown in FIG. 1 and FIG. 3, in S600, the metal layer 5 is processed using the patterning process for one time and an oxidation treatment process, so that the metal layer 5 forms the source electrode 501, the drain electrode 502 and the passivation layer 500 includes steps 610~660 (S510~S560).

In S610, a photoresist layer (not shown in FIG. 1) is formed on a surface of the metal layer 5.

In S620, the photoresist layer is processed using the patterning process for one time, so that the photoresist layer forms a photoresist completely-removed region (a portion without the photoresist shown in FIG. 1), photoresist partly-reserved regions 61, 62, and a photoresist completely-reserved region 63. The photoresist partly-reserved region 62 is connected to the photoresist completely-reserved region 63.

In S630, a complete oxidation treatment is performed on a region of the metal layer 5 corresponding to the photoresist completely-removed region to form a first passivation portion.

Illustratively, in this step, a photoresist in the photoresist partly-reserved regions 61, 62 masks a region of the metal layer 5 corresponding to the photoresist partly-reserved regions 61, 62, and the photoresist in the photoresist completely-reserved region 63 masks a region of the metal layer 5 corresponding to the photoresist partly-reserved regions 61, 62.

In S640, a photoresist in the photoresist partly-reserved regions 61, 62 is removed.

In S650, a region of the metal layer 5 corresponding to the photoresist partly-reserved regions 61, 62 is partially oxidized to form the source electrode 501, the drain electrode 502 and a second passivation portion. The source electrode 501 and the drain electrode 502 are in contact with the active layer 4, and the second passivation portion is formed on the side of the source electrode 501 and the drain electrode 502 away from the active layer 4. The first passivation portion and the second passivation portion form the passivation layer 500.

Illustratively, in this step, the photoresist in the photoresist completely-reserved region 63 masks the region of the metal layer 5 corresponding to the photoresist completely-reserved region 63.

In S660, a photoresist in the photoresist completely-reserved region 63 is removed to form the conductive portion 503 connected to the source electrode 501 and the drain electrode 502.

By further limiting the above-mentioned steps of processing the metal layer 5 using the patterning process for one time and the oxidation treatment process, it may be found that, the photoresist layer is processed using the patterning process for one time, so that after the photoresist layer forms the complete-removed region, the photoresist partly-reserved regions 61, 62 and the photoresist completely-reserved region 63, the photoresist completely-reserved region 63 still exists when the region of the metal layer 5 corresponding to the photoresist completely-removed region is completely oxidized and the region of the metal layer 5 corresponding to the photoresist partly-reserved regions 61, 62 is partially oxidized. In this way, the conductivity of the region of the metal layer corresponding to the photoresist completely-reserved region 63 still exists after the formation of the source electrode 501 and the drain electrode 502 and the passivation layer 500 is completed. Since the photoresist partly-reserved regions 61, 62 are connected to the photoresist completely-reserved region 63, the region of the metal layer 5 corresponding to the photoresist partly-reserved regions 61, 62 is integrated with the region of the metal layer 5 corresponding to the photoresist completely-reserved region 63. Therefore, when the region of the metal layer 5 corresponding to the photoresist partly-reserved regions 61, 62 is partially oxidized, only a part of the metal material away from the active layer 4 in the region of the metal layer 5 corresponding to the photoresist partly-reserved regions 61, 62 is oxidized. A part of the metal material adjacent to the active layer 4 in the region of the metal layer 5 corresponding to the photoresist partly-reserved regions 61, 62 is not oxidized (the metal material away from the active layer 4 and the metal material adjacent to the active layer 4 are divided according to a thickness direction of the metal layer 5, and the metal material adjacent to the active layer 4 may also be considered as in contact with the active layer 4 and the metal material away from the active layer 4 may also be considered as not being in contact with the active layer 4), and this part of the metal material is used to form the source electrode 501 and the drain electrode 502. Therefore, when the formation of the source electrode 501, the drain electrode 502 and the second passivation portion is completed, the region of the metal layer 5 corresponding to the photoresist completely-reserved region 63 may be electrically connected to the source and the drain as the conductive portion 503. In this way, when the array substrate is manufactured, only the pixel electrode 7 needs to be formed on the passivation layer 500, and ensuring the pixel electrode 7 being in contact with a metal wire 503, so that the pixel electrode 7 and the second electrode 502 may be electrically connected to each other, thereby avoiding the problem that the via hole is manufactured in the passivation layer 500 by the dryness etching process resulting in a long production time of the array substrate.

Illustratively, the method for processing the photoresist layer by using the patterning process for one time is a halftone masking process, and may also be other processes. Processing the photoresist layer by using the patterning process for one time includes the following contents.

The photoresist layer is photolithographed using a halftone mask as a mask, and then developed so that the photoresist layer forms the photoresist completely-removed region (a portion without the photoresist shown in FIG. 1), the photoresist partly-reserved regions 61, 62 and the photoresist completely-reserved region 63. The photoresist partly-reserved regions 61, 62 and the photoresist completely-reserved region 63 are formed on a surface of the metal layer 5 in accordance with the positions of the source electrode 501, the drain electrode 502 and the position of the via hole. The photoresist partly-reserved regions 61, 62 correspond to the positions of the source electrode 501 and the drain electrode 502, and the photoresist completely-reserved region 63 corresponds to the position of the via hole. It should be noted here that, although the photoresist completely-reserved region 63 corresponds to the position of the via hole, it actually represents the region of the metal layer 5 that is the conductive portion 503 served as the via hole, and it may not be explained that the embodiments have the process step of manufacturing the via hole.

Illustratively, as shown in FIG. 1, the region of the metal layer 5 corresponding to the photoresist completely-removed region includes a metal portion A1 corresponding to a first completely-removed region, a metal portion A2 corresponding to a second completely-removed region, and a metal portion A3 corresponding to a third completely-removed region. The metal portion A1 corresponding to the first completely-removed-region is completely oxidized to form a first sub-portion A1' of the first passivation portion. The metal portion A2 corresponding to the second completely-removed-region is completely oxidized to form a second sub-portion A2' of the first passivation portion. The metal portion A3 corresponding to the third completely-removed region is completely oxidized to form a third sub-portion A3' of the first passivation portion.

As shown in FIG. 1, positions of orthographic projections of the photoresist partly-reserved regions 61, 62 on the metal layer 5 correspond to the positions of the source electrode 501 and the drain electrode 502, and the photoresist partly-reserved regions 61, 62 includes a first photoresist partly-reserved region 61 and a second photoresist partly-reserved region 62. A position of an orthographic projection of the first photoresist partly-reserved region 61 on the metal layer 5 corresponds to a position of the source electrode 501, and a position of an orthographic projection of the second photoresist partly-reserved region 62 on the metal layer 5 corresponds to a position of the drain electrode 502.

A gap is provided between the first photoresist partly-reserved region 61 and the second photoresist partly-reserved region 62, and the second photoresist partly-reserved region 62 is connected to the photoresist completely-reserved region 63. A region of the metal layer 5 corresponding to the first photoresist partly-reserved region 61 is a metal portion B1 corresponding to a first partly-reserved region, and a region of the metal layer 5 corresponding to the second photoresist partly-reserved region 62 is a metal portion B2 corresponding to a second partly-reserved region. The metal portion A2 corresponding to the second completely-removed-region is located between the metal portion B1 corresponding to the first partly-reserved region and the metal portion B2 corresponding to the second partly-reserved region. The metal portion B1 corresponding to the first partly-reserved region is partially oxidized to form a first sub-portion B1' of the second passivation portion and the source electrode 501 which are distributed up and down in the thickness direction of the metal layer 5. The source 501 is in contact with the active layer 4, and the first sub-portion B1' of the second passivation portion is located on a side of the source electrode 501 away from the active layer 4. The metal portion B2 corresponding to the second partly-reserved region is partially oxidized to form a second sub-portion B2' of the second passivation portion and the drain electrode 502 which are distributed up and down in the thickness direction of the metal layer 5. The drain electrode 502 is in contact with the active layer 4, and the second sub-portion B2' of the second passivation is located on a side of the drain electrode 502 away from the active layer 4.

As shown in FIG. 1, an orthographic projection of the photoresist completely-reserved region 63 on the metal layer 5 corresponds to a position of the via hole, and a region of the metal layer 5 corresponding to the photoresist completely-reserved region 63 is a metal portion C corresponding to a completely-reserved region. After the photoresist completely-reserved region 63 is removed, the metal portion C corresponding to the completely-reserved region is connected to the drain electrode 502 as the conductive portion 503.

In addition, as shown in FIG. 1, since a thickness of the photoresist in the photoresist completely-reserved region 63 is greater than a thickness of the photoresist in the photoresist partly-reserved regions 61, 62, even if the photoresist completely-reserved region 63 is affected by a photoresist removal process, the photoresist in the photoresist completely-reserved region 63 is not completely removed, when the photoresist in the photoresist partly-reserved regions 61, 62 is removed in the case that there is no protection in the photoresist completely-reserved region 63. The thickness of the photoresist completely-reserved region 63 is just reduced when the photoresist in the photoresist partly-reserved regions 61, 62 has been removed.

Illustratively, a processing time of performing the complete oxidation treatment on the region of the metal layer 5 corresponding to the photoresist completely-removed region is greater than or equal to twice of a processing time of performing the partial oxidation treatment on the region of the metal layer 5 corresponding to the photoresist partly-reserved regions 61, 62.

Optionally, in the above embodiments, an anodic oxidation method may be used when the completely oxidization is performed on the region of the metal layer 5 corresponding to the photoresist completely-removed region and a partially oxidization is performed on the region of the metal layer 5 corresponding to the photoresist partly-reserved regions 61, 62. When the region of the metal layer 5 corresponding to the photoresist completely-removed region is completely oxidized by the anodic oxidation method and the region of the metal layer 5 corresponding to the photoresist reserved region is partially oxidized by the anodic oxidation method, a portion of the metal layer 5 to be oxidized may be used as an anode and a graphite electrode or a platinum metal electrode may be used as a cathode when the anode is oxidized. Then, a constant voltage power supply or a constant current power supply is connected between the anode and the cathode, both the anode and the cathode are immersed in an electrolyte solution, and the anode is oxidized by applying electricity. Illustratively, the electrolyte solution may be a weak acid solution or a weak base solution, such as a citric acid solution or an ammonium tartrate solution.

Illustratively, oxygen flows accessed when performing the complete oxidation treatment on the region of the metal layer 5 corresponding to the photoresist completely-removed region by using the anodic oxidation method and when performing the partial oxidation treatment on the region of the metal layer 5 corresponding to the photoresist partly-reserved regions 61, 62 by using the anodic oxidation method are the same. Further, the processing time of performing the complete oxidation treatment on the region of the metal layer 5 corresponding to the photoresist completely-removed region is greater than or equal to twice of the processing time of performing the partial oxidation treatment on the region of the metal layer 5 corresponding to the photoresist partly-reserved regions 61, 62.

When the material of the metal layer 5 is Al, the electrochemical reaction at the anode is: $2Al+3H_2O \rightarrow Al_2O_3+6e^-+6H^+$, and the electrochemical reaction at the cathode is: $6H_2O+6e^- \rightarrow 3H_2+6OH^-$. From this, it can be seen that the reaction at the anode is a metal oxidation reaction and the oxidation of the anode may be performed at a room temperature. Therefore, in the method for manufacturing the thin film transistor provided by the embodiments of the present disclosure, if the base substrate 1 is a flexible substrate that is not resistant to high temperatures, the anodic oxidation method will not damage the flexible substrate. In this way, the method for manufacturing the thin film transistor provided by the embodiments of the present disclosure is suitable for the flexible display technology, and does not require expensive high-temperature process equipment such as chemical vapor deposition equipment, so that the production cost will be greatly reduced.

Illustratively, as shown in FIG. 1, the performing the complete oxidation treatment on the region of the metal layer 5 corresponding to the photoresist completely-removed region includes the following contents.

The region of the metal layer 5 corresponding to the photoresist completely-removed region is completely oxidized by the anodic oxidation method. The metal material of the metal layer 5 corresponding to the photoresist completely-removed region is oxidized to a metal oxide, so that the region of the metal layer 5 corresponding to the photoresist completely-removed region forms the first passivation portion. The first passivation portion is composed of the first sub-portion A1' of the first passivation portion, a second subsection A2' of the first passivation portion and a third subsection A3' of the first passivation portion.

The metal material of the metal layer 5 corresponding to the photoresist completely-removed region refers to all of the metal materials of the metal layer 5 covered by an orthographic projection of the photoresist completely-removed region on the metal layer 5. That is, as shown in FIG. 1, the metal material of the metal layer 5 corresponding to the photoresist completely-removed region comprises all materials of the metal portion A1 corresponding to the first completely-removed region, all materials of the metal portion A2 corresponding to the second completely-removed region and all materials of the metal portion A3 corresponding to the third completely-removed region.

It should be noted that, since the anodic oxidation method is used to oxidize a surface of the metal layer 5 corresponding to the photoresist completely-removed region, the region of the metal layer 5 corresponding to the photoresist completely-removed region should be used as the anode, and the graphite electrode or the platinum metal electrode may be used as the cathode. By controlling the oxidation time, all of the metal materials in the region of the metal layer 5 corresponding to the photoresist completely-removed region are oxidized to metal oxides, and these the metal oxides form the first passivation portion.

As shown in FIG. 1, when the region of the metal layer 5 corresponding to the photoresist partly-reserved regions 61, 62 is partially oxidized by the anodic oxidation method, the partially oxidizing the region of the metal layer 5 corresponding to the photoresist partly-reserved regions 61, 62 includes the following contents.

A surface of the metal layer 5 corresponding to the photoresist partly-reserved regions 61, 62 is oxidized by the anodic oxidation method, and an upper portion of the metal material of the metal layer 5 corresponding to the photoresist partly-reserved regions 61, 62 is oxidized to the metal oxide, so that the upper portion of the metal layer 5 corresponding to the photoresist partly-reserved regions 61, 62 forms the second passivation. A lower portion of the metal material of the metal layer 5 corresponding to the photoresist partly-reserved regions 61, 62 forms the source electrode 501 and the drain electrode 502, and the second passivation portion, the source electrode 501 and the drain electrode 502 are distributed up and down along the thickness direction of the metal layer 5. The second passivation portion includes the first sub-portion B1' of the second passivation portion and the second sub-portion B2' of the second passivation portion.

The upper portion of the metal material of the metal layer 5 corresponding to the photoresist partly-reserved regions 61, 62 refers to an upper part of the metal material of the metal layer 5 covered by an orthographic projection of the photoresist partly-reserved regions 61, 62. As shown in FIG. 1, the upper portion of the metal material of the metal layer 5 corresponding to the photoresist partly-reserved regions 61, 62 includes an upper portion of the metal portion B1 corresponding to the first photoresist partly-reserved region 61 and an upper portion of the metal portion B2 corresponding to the second photoresist partly-reserved region 62.

The lower portion of the metal material of the metal layer 5 corresponding to the photoresist partly-reserved regions 61, 62 refers to a lower part of the metal material of the metal layer 5 covered by an orthographic projection of the photoresist partly-reserved regions 61, 62. As shown in FIG. 1, the lower portion of the metal material of the metal layer 5 corresponding to the photoresist partly-reserved regions 61, 62 includes a lower of the metal portion B1 corresponding to the first photoresist partly-reserved region 61 and a lower of the metal portion B2 corresponding to the second photoresist partly-reserved region 62.

It should be noted that, since the anodic oxidation method is used to oxidize a surface of the metal layer 5 corresponding to the photoresist partly-reserved regions 61, 62, the surface of the metal layer 5 corresponding to the photoresist partly-reserved regions 61, 62 should be used as the anode and the graphite electrode or the platinum metal electrode may be used as the cathode. By controlling the oxidation time, the upper portion of the metal material of the metal layer 5 corresponding to the photoresist partly-reserved regions 61, 62 is oxidized to the metal oxide, and the metal oxide forms the second passivation portion.

In addition, there are various methods for removing the photoresist in the photoresist partly-reserved regions 61, 62 and the photoresist in the photoresist completely-reserved region 63. For example: a photoresist ashing treatment process or a plasma oxidation treatment process.

Illustratively, the removing the photoresist in the photoresist partly-reserved regions 61, 62 by the photoresist ashing process includes: the photoresist in the photoresist partly-reserved regions 61, 62 is processed by the photoresist ashing treatment process, so that the photoresist in the photoresist partly-reserved regions 61, 62 is ashed, thereby removing the photoresist in the photoresist partly-reserved regions 61, 62.

The removing the photoresist in the photoresist completely-reserved region 63 by the photoresist ashing process includes: the photoresist in the photoresist completely-reserved region 63 is processed by the photoresist ashing treatment process, so that the photoresist in the photoresist completely-reserved region 63 is ashed, thereby removing the photoresist in the photoresist completely-reserved region 63.

Illustratively, the removing the photoresist in the photoresist partly-reserved regions 61, 62 by using the plasma oxidation treatment process includes: the photoresist in the photoresist partly-reserved regions 61, 62 is oxidized by the plasma oxidation treatment process, so that the photoresist in the photoresist partly-reserved regions 61, 62 is oxidized to gas, thereby removing the photoresist in the photoresist partly-reserved regions 61, 62.

The removing the photoresist in the photoresist completely-reserved region 63 by the plasma oxidation treatment process includes: the photoresist in the photoresist completely-reserved region 63 is oxidized by the plasma oxidation treatment process, so that the photoresist in the photoresist completely-reserved region 63 is oxidized to gas, thereby removing the photoresist in the photoresist completely-reserved region.

Considering that the plasma oxidation treatment process can not only oxidize the photoresist to gas, thereby realizing the removal of the photoresist, but also oxidize the metal materials into oxides through the oxidation treatment, thus the region of the metal layer 5 corresponding to the photoresist partly-reserved regions 61, 62 may be partially oxidized by the plasma oxidation treatment process, and the region of the metal layer 5 corresponding to the photoresist completely-removed region may be completely oxidized by the plasma oxidation treatment process.

Optionally, a complete oxidation treatment performed on the region of the metal layer 5 corresponding to the photoresist completely-removed region and a removal of the photoresist in the photoresist partly-reserved regions 61, 62 are both completed in one plasma oxidation process. In this way, when the region of the metal layer 5 corresponding to the photoresist completely-removed region is completely oxidized, the photoresist in the photoresist partly-reserved regions 61, 62 can be removed at the same time, so that these two steps can be combined to one step, thereby simplifying the method of manufacturing the thin film transistor.

Moreover, after the photoresist in the photoresist partly-reserved regions 61, 62 is removed, the upper portion of the metal material of the metal layer 5 corresponding to the photoresist partly-reserved regions 61, 62 also needs to be oxidized. Therefore, even if the region of the metal layer 5 corresponding to the photoresist completely-removed region is not completely oxidized when the photoresist in the photoresist partly-reserved regions 61, 62 has been completely-removed, the region of the metal layer 5 corresponding to the photoresist completely-removed region may also be continued to be oxidized. During this period, if the region of the metal layer 5 corresponding to the photoresist partly-reserved regions 61, 62 is not protected, the region of the metal layer 5 corresponding to the photoresist partly-reserved regions 61, 62 may also be partially oxidized, so that the region of the metal layer 5 corresponding to the photoresist completely-removed region is completely oxidized, the photoresist in the photoresist partly-reserved regions 61, 62 is removed and the region of the metal layer corresponding to the photoresist partly-reserved regions 61, 62 is partially oxidized by performing the oxidation treatment process for one time.

In addition, since a thickness of the metal materials of the region of the metal layer 5 corresponding to the photoresist partly-reserved regions 61, 62 is the same as that of the materials of the region of the metal layer 5 corresponding to the photoresist completely-removed region, and the photoresist partly-reserved regions 61, 62 are formed on the region of the metal layer 5 corresponding to the photoresist partly-reserved regions 61, 62, when the metal materials of the region of the metal layer 5 corresponding to the photoresist completely-removed region is completely oxidized, the lower portion of the metal material of the region of the metal layer 5 corresponding to the photoresist partly-reserved regions 61, 62 is not oxidized in one plasma oxidation treatment process, and the lower portion of the metal material of the region of the metal layer 5 corresponding to the photoresist partly-reserved regions 61, 62 forms the source electrode 501 and the drain electrode 502.

It should be noted that, since the region of the metal layer 5 corresponding to the photoresist completely-reserved region 63 needs to be connected to electrode 501 and the drain electrode 502 as the conductive portion 503 to ensure that the pixel electrode 7 formed on the surface of the passivation layer 500 can be in contact with the conductive portion 503 through the passivation layer 500 and making the pixel electrode 7, the source electrode 501 and the drain electrode 502 are electrically connected, the metal material of the metal layer 5 corresponding to the photoresist completely-reserved region 63 cannot be oxidized. Therefore, the photoresist completely-reserved region 63 needs to be protected when the plasma oxidation treatment is performed on the upper portion of the metal material of the metal layer 5 corresponding to the photoresist partly-reserved regions 61, 62, in order to avoid that the region of the metal layer 5 corresponding to the photoresist completely-reserved region 63 is oxidized after the photoresist in the photoresist completely-reserved region 63 is completely-removed in a case that the photoresist completely-reserved region 63 is not protected.

Illustratively, as shown in FIG. 1, the performing the complete oxidation treatment on the region of the metal layer 5 corresponding to the photoresist completely-removed region includes the following contents.

The region of the metal layer 5 corresponding to the photoresist completely-removed region is completely oxidized by the plasma oxidation treatment process, and the metal material of the metal layer 5 corresponding to the photoresist completely-removed region is oxidized to the metal oxide, so that the region of the metal layer 5 corresponding to the photoresist completely-removed region forms the first passivation portion.

The metal material of the metal layer 5 corresponding to the photoresist completely-removed region refers to all of the metal materials of the metal layer 5 covered by the orthographic projection of the photoresist completely-removed region on the metal layer 5.

As shown in FIG. 1, the partially oxidizing the region of the metal layer 5 corresponding to the photoresist partly-reserved regions 61, 62 includes the following contents.

The surface of the metal layer 5 corresponding to the photoresist partly-reserved regions 61, 62 is oxidized by the plasma oxidation treatment process, and the upper portion of the metal material of the metal layer 5 corresponding to the photoresist partly-reserved regions 61, 62 is oxidized to the metal oxide, so that the upper portion of the metal layer 5 corresponding to the photoresist partly-reserved regions 61, 62 forms the second passivation portion and the lower portion of the metal material of the metal layer 5 corresponding to the photoresist partly-reserved regions 61, 62 forms the source electrode 501 and the drain electrode 502.

The upper portion of the metal material of the metal layer 5 corresponding to the photoresist partly-reserved regions 61, 62 refers to the upper part of the metal material of the metal layer 5 covered by the orthographic projection of the photoresist partly-reserved regions 61, 62.

The lower portion of the metal material of the metal layer 5 corresponding to the photoresist partly-reserved portion refers to the lower part of the metal material of the metal layer 5 covered by the orthographic projection of the photoresist partly-reserved regions 61, 62.

Illustratively, in some embodiments of the present disclosure, in cases that the plasma oxidation treatment process is used for performing the complete oxidation treatment for the region of the metal layer 5 corresponding to the photoresist completely-removed region and performing the partial oxidation treatment for the region of the metal layer 5 corresponding to the photoresist partly-reserved regions 61, 62, a upper bias voltage is 100 W, and a lower bias voltage is 0 W, that is, a self-bias voltage is not applied. And an oxygen flow accessed is 50 sccm, the processing time of the complete oxidation treatment is 20 s~50 s, and the processing time of the partial oxidation treatment is 10 s~20 s. That is, the processing time of the complete oxidation treatment is greater than or equal to twice of the processing time of the partial oxidation treatment.

In the method for manufacturing the thin film transistor provided by the present disclosure, since the metal layer 5 is processed by the combination of using the patterning process for one time and the oxidation treatment process after the metal layer 5 is formed on the surface of the active layer 4, the portion of the metal materials of the metal layer 5 is not oxidized, and thereby the source electrode 501 and the drain electrode 502 contacting with the active layer 4 are formed. And the another portion of the metal materials of the metal layer 5 is oxidized to the non-conductive metal oxide to form the passivation layer 500 on the side of the source electrode 501 and the drain electrode 502 away from the active layer 4. It can be seen that, in the method for manufacturing the thin film transistor provided by the present disclosure, the source electrode 501, the drain electrode 502 and the passivation layer 500 can be formed by only one film formation process combining the patterning process and the oxidation treatment process. Therefore, the method for manufacturing the thin film transistor provided by the present disclosure is relatively simple, which is advantageous to simplify the method for manufacturing the thin film transistor.

As shown in FIG. 1, the embodiments of the present disclosure also provide a method for manufacturing an array substrate using the method for manufacturing the thin film transistor described above. The method for manufacturing the array substrate includes the following steps.

In a first step, an active layer 4 is formed on a base substrate 1.

In a second step, a metal layer 5 is formed on a surface of the active layer 4.

In a third step, the metal layer 5 is processed using a patterning process for one time and an oxidation treatment process, so that the metal layer 5 forms a source electrode 501, a drain electrode 502, a passivation layer 500 and a conductive portion 503 connected to the source electrode 501 and the drain electrode 502. The source electrode 501 and the drain electrode 502 are in contact with the active layer 4, and the passivation layer 500 is formed on a side of the source electrode 501 and the drain electrode 502 away from the active layer 4.

In a fourth step, a pixel electrode 7 is formed on a surface of the passivation layer 500, and the pixel electrode 7 is connected to the source electrode 501 and the drain electrode 502 through the conductive portion 503.

The beneficial effects of the method for manufacturing the array substrate provided in the embodiments of the present disclosure are the same as that of the method for manufacturing the thin film transistor provided in the above embodiments, which will not be described here.

Illustratively, as shown in FIG. 1 and FIG. 3, the third step in which the metal layer 5 is processed using the single patterning process for one time and the oxidation process, so that the metal layer 5 forms the source electrode 501 and the drain electrode 502, the passivation layer 500 and the conductive portion connected to the source electrode 501 and the drain electrode 502 includes steps 510~560 (S510~S560).

In S610, a photoresist layer (not shown in FIG. 1) is formed on a surface of the metal layer 5.

In S620, the photoresist layer is processed using the patterning process for one time to form a photoresist completely-removed region, photoresist partly-reserved regions 61, 62, and a photoresist completely-reserved region 63. The photoresist partly-reserved region 62 is connected to the photoresist completely-reserved region 63.

In S630, a region of the metal layer 5 corresponding to the photoresist completely-removed region is performed a complete oxidation treatment to form a first passivation portion.

In S640, the photoresist in the photoresist partly-reserved regions 61, 62 is removed.

In S650, a region of the metal layer 5 corresponding to the photoresist partly-reserved regions 61, 62 is partially oxidized to form the source electrode 501, the drain electrode 502 and a second passivation portion. The source electrode 501 and the drain electrode 502 are in contact with the active layer 4, and the second passivation portion is formed on the side of the source electrode 501 and the drain electrode 502 away from the active layer 4. The first passivation portion and the second passivation portion form the passivation layer 500.

In S660, the photoresist in the photoresist completely-reserved region 63 is removed to form a conductive portion 503 connected with the source electrode 501 and the drain electrode 502.

Figure 4:
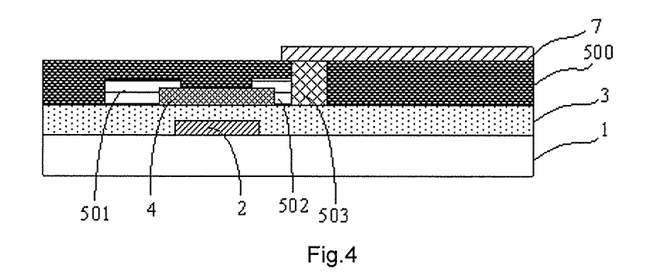
FIG. 4 is a schematic structural diagram of an array substrate provided in some embodiments of the present disclosure.

As shown in FIG. 4, the embodiments of the present disclosure also provide an array substrate, which is manufactured by the method for manufacturing the array substrate provided by the above embodiments.

In the method for manufacturing the thin film transistor provided by the present disclosure, since the metal layer 5 is processed by the combination of using the patterning process for one time and the oxidation treatment process after the metal layer 5 is formed on the surface of the active layer 4, the portion of the metal materials of the metal layer 5 is not oxidized, and thereby the source electrode 501 and the drain electrode 502 contacting with the active layer 4 is formed. And the another portion of the metal materials of the metal layer 5 is oxidized to the non-conductive metal oxide to form the passivation layer 500 on the side of the source electrode 501 and the drain electrode 502 away from the active layer 4. It can be seen that, in the method for manufacturing the thin film transistor provided by the present disclosure, the source electrode 501, the drain electrode 502 and the passivation layer 500 can be formed by only one film formation process combining the patterning process and the oxidation treatment process. Therefore, the method for manufacturing the thin film transistor provided by the present disclosure is relatively simple, which is advantageous to simplify the method for manufacturing the thin film transistor. Based on this, in the method for manufacturing the array substrate provided by the present disclosure, the conductive portion 503 connected to the source electrode 501 and the drain electrode 502 may be formed while the metal layer 5 forms the source electrode 501, the drain electrode 502 and the passivation layer 500 by the combination of using the patterning process for one time and the oxidation treatment process, so that the pixel electrode 7 is able to connected to the source electrode 501 and the drain electrode 502 through the conductive portion 503 when the pixel electrode 7 is formed on the surface of the passivation layer 500, thereby skipping the process step of forming the via in the passivation layer 500.

Some embodiments of the present disclosure further provide a display device. The display device includes the array substrate provided by the above embodiments.

The beneficial effects of the display device provided by the present disclosure are the same as that of the method for manufacturing the thin film transistor provided in the above embodiments, which will not be described in detail herein.

The display device provided by the above embodiments may be any product or component having a display function such as a mobile phone, a tablet computer, a television, a display, a notebook computer, a digital photo frame or a navigator.

In the above description of the embodiments, specific features, structures, materials, or characteristics may be combined in any suitable manner in any one or more embodiments or examples.

The foregoing descriptions are merely specific implementations of the present disclosure, but the protection scope of the present disclosure is not limited thereto. Any person skilled in the art may easily think that change or replacement within the technical scope disclosed by the present disclosure should be within the scope of the disclosure. Therefore, the protection scope of the present disclosure should be based on the protection scope of the claims.

Additional embodiments including any one of the embodiments described above may be provided by the disclosure, where one or more of its components, functionalities or structures is interchanged with, replaced by or augmented by one or more of the components, functionalities or structures of a different embodiment described above.

What is claimed is:

1. A method for manufacturing a thin film transistor, comprising:
    forming an active layer on a base substrate;
    forming a metal layer on a surface of the active layer;
    processing the metal layer using a patterning process for one time and an oxidation treatment process to form a source electrode, a drain electrode and a passivation layer, the source electrode and the drain electrode are in contact with the active layer, and the passivation layer is formed on a side of the source electrode and the drain electrode away from the active layer, which includes:
        forming a photoresist layer on a surface of the metal layer;
        processing the photoresist layer using the patterning process for one time to form a photoresist completely-removed region, photoresist partly-reserved regions and a photoresist completely-reserved region; wherein the photoresist partly-reserved regions are connected to the photoresist completely-reserved region;

performing a complete oxidation treatment on a region of the metal layer corresponding to the photoresist completely-removed region to form a first passivation portion;

removing a photoresist in the photoresist partly-reserved regions;

performing a partial oxidation treatment on a region of the metal layer corresponding to the photoresist partly-reserved regions to form the source electrode, the drain electrode and a second passivation portion; wherein the source electrode and drain electrode are in contact with the active layer, and the second passivation portion is formed on a side of the source electrode and the drain electrode away from the active layer; the first passivation portion and the second passivation portion form the passivation layer;

removing a photoresist in the photoresist completely-reserved region to form a conductive portion connected to the source electrode and the drain electrode.

2. The method for manufacturing the thin film transistor according to claim 1, wherein, a processing time of performing the complete oxidation treatment on the region of the metal layer corresponding to the photoresist completely-removed region is greater than or equal to twice of a processing time of performing the partial oxidation treatment on the region of the metal layer corresponding to the photoresist partly-reserved regions.

3. The method for manufacturing the thin film transistor according to claim 1, wherein, the performing the complete oxidation treatment on the region of the metal layer corresponding to the photoresist completely-removed region to form the first passivation portion comprises:

performing an oxidation treatment on the region of the metal layer corresponding to the photoresist completely-removed region by an anodic oxidation method, and a metal material of the metal layer corresponding to the photoresist completely-removed region is oxidized to a metal oxide, so that the region of the metal layer corresponding to the photoresist completely-removed region forms the first passivation portion.

4. The method for manufacturing the thin film transistor according to claim 1, wherein, the performing the partial oxidation treatment on the region of the metal layer corresponding to the photoresist partly-reserved regions comprises:

performing an oxidation treatment on the region of the metal layer corresponding to the photoresist partly-reserved regions by an anodic oxidation method, and an upper portion of a metal material of the metal layer corresponding to the photoresist partly-reserved regions is oxidized to a metal oxide, so that the upper portion of the metal material of the metal layer corresponding to the photoresist partly-reserved regions forms the second passivation portion, and a lower portion of the metal material of the metal layer corresponding to the photoresist partly-reserved regions forms the source electrode and the drain electrode.

5. The method for manufacturing the thin film transistor according to claim 1, wherein, the performing the complete oxidation treatment on the region of the metal layer corresponding to the photoresist completely-removed region comprises:

performing an oxidation treatment on the region of the metal layer corresponding to the photoresist completely-removed region by a plasma oxidation treatment process, and a metal material of the metal layer corresponding to the photoresist completely-removed region is oxidized to a metal oxide, so that the region of the metal layer corresponding to the photoresist completely-removed region forms the first passivation portion.

6. The method for manufacturing the thin film transistor according to claim 5, wherein, the removing the photoresist in the photoresist partly-reserved regions comprises:

performing an oxidation treatment on the photoresist in the photoresist partly-reserved regions by the plasma oxidation treatment process, so that the photoresist in the photoresist partly-reserved regions is oxidized to gas;

the performing the complete oxidation treatment on the region of the metal layer corresponding to the photoresist completely-removed region and the removing the photoresist in the photoresist partly-reserved regions are completed in one plasma oxidation treatment process.

7. The method for manufacturing the thin film transistor according to claim 1, wherein, the performing the partial oxidation treatment on the region of the metal layer corresponding to the photoresist partly-reserved regions comprises:

performing an oxidation treatment on the region of the metal layer corresponding to the photoresist partly-reserved regions by a plasma oxidation treatment process, and an upper portion of a metal material of the metal layer corresponding to the photoresist partly-reserved regions is oxidized to a metal oxide, so that the upper portion of the metal layer corresponding to the photoresist partly-reserved regions forms the second passivation portion, and a lower portion of the metal material of the metal layer corresponding to the photoresist partly-reserved regions forms the source electrode and the drain electrode.

8. The method for manufacturing the thin film transistor according to claim 1, wherein, the removing the photoresist in the photoresist completely-reserved region comprises: performing an oxidation treatment on the photoresist in the photoresist completely-reserved region by a plasma oxidation treatment process, so that the photoresist in the photoresist completely-reserved region is oxidized to gas.

9. The method for manufacturing the thin film transistor according to claim 1, wherein, a method for processing the photoresist layer using the patterning process for one time is a halftone mask process.

10. The method for manufacturing the thin film transistor according to claim 1, wherein, a material of the metal layer is selected from a group of aluminum, magnesium, titanium, aluminum alloy, magnesium alloy and titanium alloy.

11. The method for manufacturing the thin film transistor according to claim 1, wherein, before forming the active layer on the base substrate, the method for manufacturing the thin film transistor further comprises:

forming a gate layer on a surface of the base substrate;

forming a gate insulating layer on a surface of the gate layer, so that the active layer is formed on a surface of the gate insulating layer.

12. A method for manufacturing an array substrate, comprising:

forming an active layer on a base substrate;

forming a metal layer on the surface of the active layer;

processing the metal layer using a patterning process for one time and an oxidation treatment process to form a source electrode, a drain electrode, a passivation layer and a conductive portion connected to the source electrode and the drain electrode, the source electrode and the drain electrode are in contact with the active layer, and the passivation layer is formed on a side of the source electrode and the drain electrode away from the active layer, which includes:

forming a photoresist layer on a surface of the metal layer;

processing the photoresist layer using the patterning process for one time to form a photoresist completely-removed region, photoresist partly-reserved regions and a photoresist completely-reserved region; the photoresist partly-reserved regions are connected to the photoresist completely-reserved region;

performing a complete oxidation treatment on a region of the metal layer corresponding to the photoresist completely-removed region to form a first passivation portion;

removing a photoresist in the photoresist partly-reserved regions;

performing a partially oxidation treatment on a region of the metal layer corresponding to the photoresist partly-reserved regions to form the source electrode, the drain electrode and a second passivation portion; wherein the source electrode and the drain electrode are in contact with the active layer, and the second passivation portion are formed on a side of the source electrode and the drain electrode away from the active layer; the first passivation portion and the second passivation portion form the passivation layer;

removing a photoresist in the photoresist completely-reserved region to form the conductive portion connected with the source electrode and the drain electrode;

forming a pixel electrode on a surface of the passivation layer, and the pixel electrode is connected to the source electrode and the drain electrode through the conductive portion.

13. The method for manufacturing the array substrate according to claim 12, wherein, a processing time of performing the complete oxidation treatment on the region of the metal layer corresponding to the photoresist completely-removed region is greater than or equal to twice of a processing time of performing the partial oxidation treatment on the region of the metal layer corresponding to the photoresist partly-reserved regions.

14. An array substrate, the array substrate being manufactured by the method for manufacturing the array substrate according to claim 12.

15. A display device, comprising the array substrate according to claim 14.

* * * * *